US011125782B2

(12) United States Patent
Nabi-Bidhendi et al.

(10) Patent No.: US 11,125,782 B2
(45) Date of Patent: Sep. 21, 2021

(54) LINE POST SENSOR

(71) Applicant: ABB Schweiz AG, Baden (CH)

(72) Inventors: Hossein Nabi-Bidhendi, Pinetops, NC (US); Vivek Siddharth, Greenville, NC (US)

(73) Assignee: ABB SCHWEIZ AG, Baden (CH)

(*) Notice: Subject to any disclaimer, the term of this patent is extended or adjusted under 35 U.S.C. 154(b) by 0 days.

(21) Appl. No.: 16/213,755

(22) Filed: Dec. 7, 2018

(65) Prior Publication Data

US 2020/0182910 A1   Jun. 11, 2020

(51) Int. Cl.
*G01R 15/04* (2006.01)
*G01R 19/00* (2006.01)
*G01R 19/10* (2006.01)

(52) U.S. Cl.
CPC ......... *G01R 15/04* (2013.01); *G01R 19/0023* (2013.01); *G01R 19/10* (2013.01)

(58) Field of Classification Search
CPC ..... G01R 15/04; G01R 19/10; G01R 19/0023
See application file for complete search history.

(56) References Cited

U.S. PATENT DOCUMENTS

| | | | |
|---|---|---|---|
| 4,074,193 A | 2/1978 | Kohler | |
| 4,158,810 A | 6/1979 | Leskovar | |
| 4,243,970 A * | 1/1981 | Hardee | B64D 47/02 307/126 |
| 5,017,859 A | 5/1991 | Engel et al. | |
| 5,136,234 A * | 8/1992 | Shaw | G01R 1/06777 324/126 |
| 5,181,026 A | 1/1993 | Granville | |
| 5,424,663 A | 6/1995 | Wong | |
| 5,432,438 A | 7/1995 | Baumgartner et al. | |
| 5,698,831 A | 12/1997 | Abdelgawad et al. | |

(Continued)

FOREIGN PATENT DOCUMENTS

| | | |
|---|---|---|
| CN | 106546790 A | 3/2017 |
| DE | 19719521 A1 | 11/1998 |

(Continued)

OTHER PUBLICATIONS

Merev et al., The construction of a DC high voltage precision divider, Journal of Electrostatics, vol. 67, No. 5, Sep. 1, 2009, pp. 741-745.

(Continued)

*Primary Examiner* — Akm Zakaria
(74) *Attorney, Agent, or Firm* — Greenberg Traurig, LLP

(57) ABSTRACT

A high voltage line post sensor for a high voltage power distribution system having a high voltage power transmission line for transmitting electrical power at a high voltage includes a voltage line sensor. The voltage line sensor includes a high voltage high resistance circuit including a first high voltage high resistance resistor coupled to the high voltage power transmission line and a second high voltage high resistance resistor coupled to the high voltage power transmission line in parallel to the first resistor; and a low voltage low resistance circuit coupled in series between the high voltage high resistance circuit and a reference voltage. The line post sensor also includes a body surrounding and encasing the high voltage high resistance circuit and the low voltage low resistance circuit.

20 Claims, 3 Drawing Sheets

(56) References Cited

U.S. PATENT DOCUMENTS

| | | | |
|---|---|---|---|
| 5,883,508 | A | 3/1999 | Ermisch et al. |
| 6,717,395 | B2 | 4/2004 | Skendzic et al. |
| 8,767,071 | B1 | 7/2014 | Marshall |
| 2002/0093326 | A1 | 7/2002 | Bierer |
| 2005/0077888 | A1* | 4/2005 | Budak .................. G01R 15/06 324/76.11 |
| 2006/0012382 | A1 | 1/2006 | Yakymyshyn et al. |
| 2008/0024112 | A1 | 1/2008 | Arrouy et al. |
| 2010/0038625 | A1* | 2/2010 | Bertin .................. G11C 13/025 257/9 |
| 2014/0207399 | A1 | 7/2014 | Roberson |
| 2018/0136256 | A1 | 5/2018 | Battistella et al. |
| 2020/0018787 | A1* | 1/2020 | Lindsey .................. G01R 15/20 |

FOREIGN PATENT DOCUMENTS

| | | | |
|---|---|---|---|
| EP | 0678956 | A1 | 10/1995 |
| EP | 1882954 | A1 | 1/2008 |
| FR | 2965058 | A1 | 3/2012 |
| WO | 2004/081589 | A1 | 9/2004 |
| WO | 2012/113575 | A2 | 8/2012 |

OTHER PUBLICATIONS

Li, Yi, Development of Precision DC High-Voltage Dividers, IEEE Transactions on Instrumentation and Measurement, vol. 60, No. 7, Jul. 1, 2011, pp. 2211-2216.

European Patent Office, European Search Report issued in corresponding European application No. 19214145.5, dated Apr. 15, 2020, 15 pp.

* cited by examiner

LINE POST SENSOR

TECHNICAL FIELD

The present application relates generally to electrical power distribution and more particularly, but not exclusively, to a line post sensor for sensing electrical parameters such as voltage in a high voltage power transmission line.

BACKGROUND

Line post sensors remain an area of interest. Some existing systems have various shortcomings, drawbacks and disadvantages relative to certain applications. For example, in some line post sensor configurations, a voltage surge, such as due to switching or lightning, may damage the sensor. Accordingly, there remains a need for further contributions in this area of technology.

SUMMARY

Embodiments of the present invention include unique line post sensors. Other embodiments include apparatuses, systems, devices, hardware, methods, and combinations for line post sensors. Further embodiments, forms, features, aspects, benefits, and advantages of the present application shall become apparent from the description and figures provided herewith.

BRIEF DESCRIPTION OF THE FIGURES

The description herein makes reference to the accompanying drawings wherein like reference numerals refer to like parts throughout the several views, and wherein.

DETAILED DESCRIPTION OF THE ILLUSTRATIVE EMBODIMENTS

Figure 1:
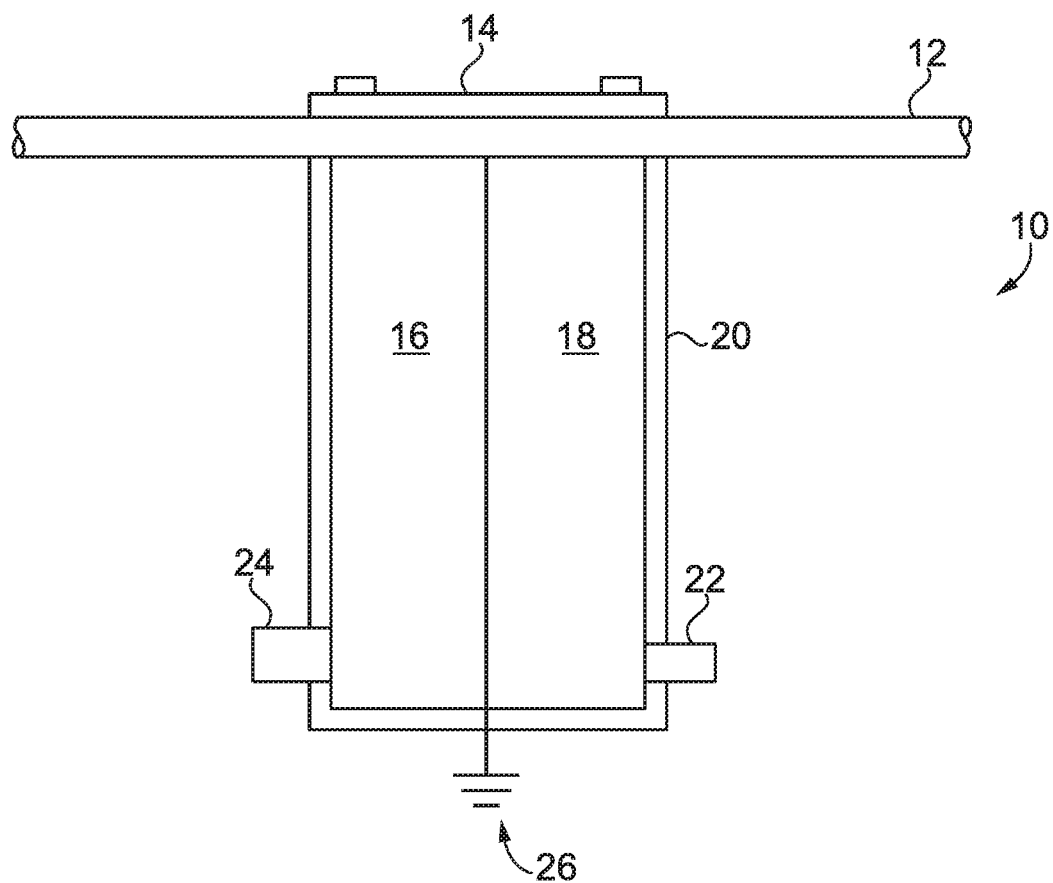
FIG. 1 schematically illustrates some aspects of a non-limiting example of a high voltage line post sensor coupled to a high voltage power transmission line in accordance with an embodiment of the present invention.

For the purposes of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

Referring to FIG. 1, some aspects of a non-limiting example of a line post sensor 10, coupled to a high voltage power transmission line 12, in accordance with an embodiment of the present invention are illustrated. High voltage power transmission line 12 transmits electrical power at a high voltage as part of a high voltage power distribution system, e.g., as part of a local or regional electrical power grid. High voltage power transmission line 12 may transmit the electrical power at 35 kV in some embodiments, 10 kV or greater in other embodiments, and greater than 35 kV in still other embodiments. In some embodiments, high voltage power transmission line 12 may transmit power at less than 10 kV. Line post sensor 10 is a high voltage line post sensor, that is, a line post sensor operating at or above 10 kV for sensing voltage (and current and/or other electrical parameters in some embodiments) in high voltage power transmission line 12 while high voltage power transmission line 12 transmits power at or above 10 kV relative to ground or another reference voltage. In some embodiments, high voltage power transmission line 12 transmits power at voltages at or above 10 kV, e.g., 35 kV, and line post sensor 10 senses electrical parameters including voltage at voltages at or above 10 kV, e.g., at 35 kV relative to ground or another reference voltage. In other embodiments, high voltage power transmission line 12 may transmit power at voltages greater than 35 kV, and line post sensor 10 may sense electrical parameters including voltage at voltages greater than 35 kV relative to ground or another reference voltage. In still other embodiments, high voltage power transmission line 12 may transmit power at voltages less than 10 kV, and line post sensor 10 may sense electrical parameters including voltage at voltages less than 10 kV relative to ground or another reference voltage.

Line post sensor 10 includes a clamp 14, a voltage current sensor 16, a voltage line sensor 18 and a body 20. Clamp 14 is constructed to physically clamp high voltage line post sensor 10 to high voltage power transmission line 12, and to electrically couple line post sensor 10 to high voltage power transmission line 12.

Voltage line sensor 18 is electrically coupled to high voltage power transmission line 12 and is constructed to measure the voltage in high voltage power transmission line 12. An electrical connector or socket 22 is electrically coupled to voltage line sensor 18 and constructed to electrically couple voltage line sensor 18 to a sensor line (not shown) for transmitting the output of voltage line sensor 18 to a receiving unit or measuring device (not shown). Voltage current sensor 16 is constructed to measure current in the high voltage power transmission line 12. An electrical connector or socket 24 is electrically coupled to voltage current sensor 16 and constructed to electrically couple voltage current sensor 16 to a sensor line (not shown) for transmitting the output of voltage current sensor 16 to a receiving unit or measurement device (not shown). Voltage line sensor 18 and voltage current sensor 16 are electrically coupled to a reference voltage, e.g., ground 26. Body 20 is constructed to surround and encase voltage line sensor 18 and voltage current sensor 16, and to partially surround and partially encase socket 22 and socket 24.

Figure 3:
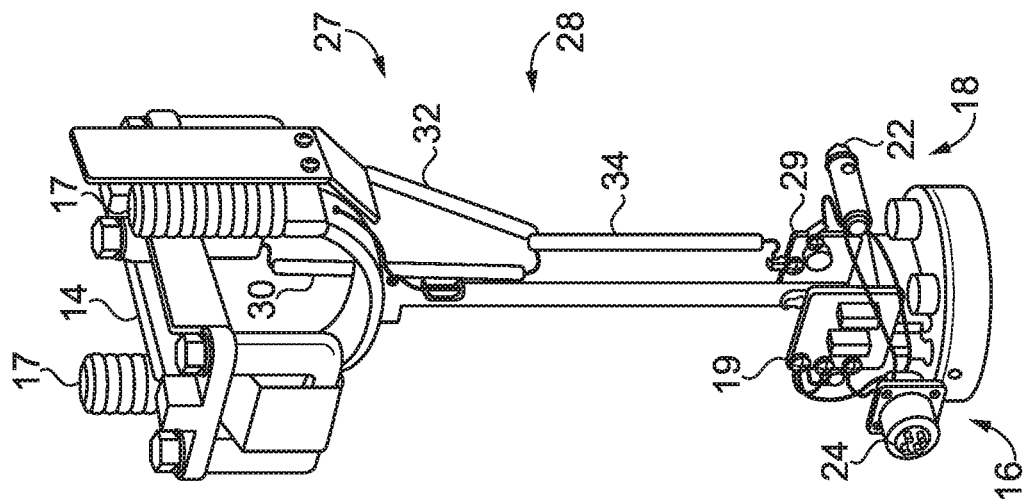
FIG. 3 schematically illustrates some aspects of a non-limiting example of a high voltage line post sensor in accordance with an embodiment of the present invention.
Figure 2:
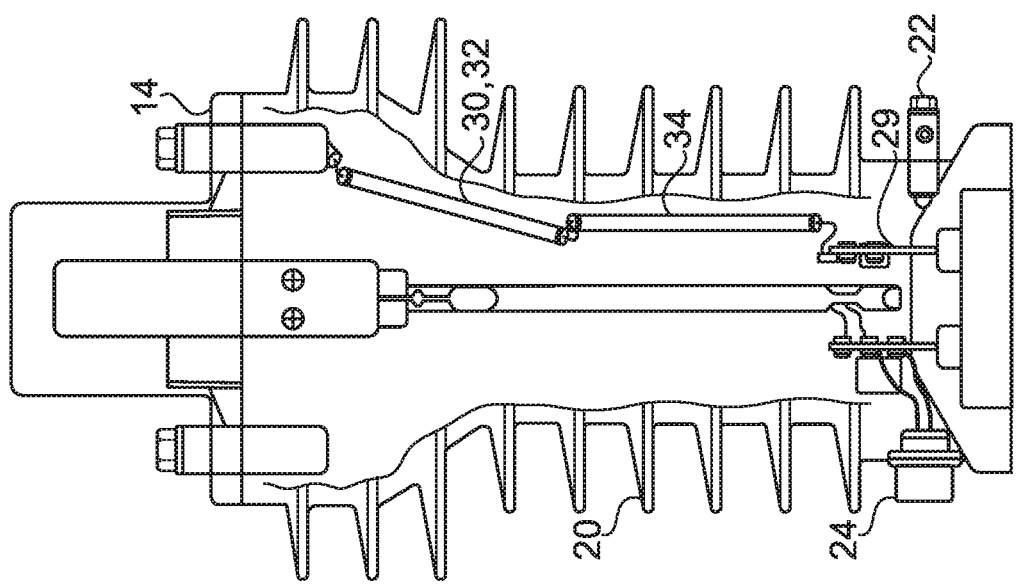
FIG. 2 schematically illustrates some aspects of a non-limiting example of a high voltage line post sensor in accordance with an embodiment of the present invention.

Referring also to FIGS. 2 and 3, voltage current sensor 16 is constructed to sense or measure the current in high voltage power transmission line 12. Voltage current sensor 16 includes coils 17 disposed adjacent to high voltage power transmission line 12 and electrically coupled to a low voltage circuit 19. Coils 17 are constructed to sense current in high voltage power transmission line 12. Low voltage circuit 19 is constructed to output a low voltage proportional to the current flow in high power transmission line 12. For example, the output voltage may be in the range of 0-10 volts to reflect a current in the range of 0-2000 amperes. In other embodiments, the voltage and/or current ranges may vary with the needs of the particular application. For example in some embodiments, the voltage range may be 0-120 V to reflect the current flow between 0 and a maximum current flow in high voltage power transmission line 12. Low voltage circuit 19 is electrically coupled to electrical connector or socket 24, and the output of low voltage circuit 19 is provided at electrical connector or socket 24, e.g., for measurement by another device.

Figure 4:
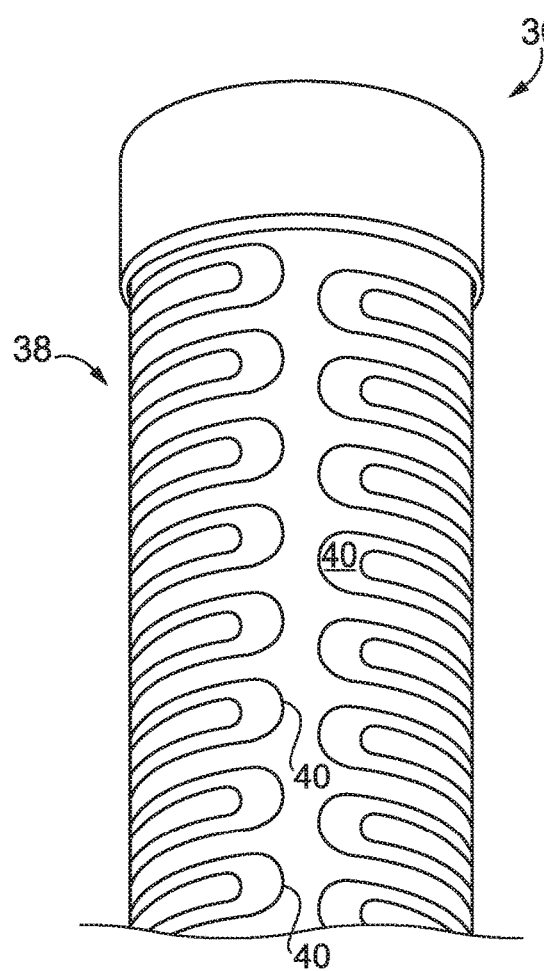
FIG. 4 schematically illustrates some aspects of a non-limiting example of a serpentine high voltage high resistance resistor.

Voltage line sensor 18 is constructed to sense or measure the voltage in high voltage power transmission line 12. Voltage line sensor 18 is electrically coupled to high voltage power transmission line 12. Voltage line sensor 18 includes a resistive voltage divider 27 formed of a high voltage high resistance circuit 28 and a low voltage low resistance circuit 29. High voltage high resistance circuit 28 is coupled in series between high voltage power transmission line 12 and low voltage low resistance circuit 29. High voltage high resistance circuit 28 includes a plurality of high voltage high resistance resistors 30, 32 and 34. The number of high voltage high resistance resistors may vary with the needs of the application. In one form, high voltage high resistance resistors 30, 32 and 34 are serpentine resistors, e.g., as depicted in FIG. 4 which illustrates a portion of high voltage high resistance resistor 30. The resistive material of high voltage resistors 30, 32 and 34 is formed into a serpentine pattern 38 made of a plurality of switchbacks or undulations 40 that provide a continuous high resistance path.

During operation, the voltage across low voltage low resistance circuit 29 is monitored, and the ratio of the resistances (the resistance of high voltage high resistance circuit 28, in ratio with the resistance of low voltage low resistance circuit 29) is used to determine the voltage level in high voltage power transmission line 12. This system provides low energy coupling, but enough output for reading by receiving devices such as electronic meters.

The high voltage high resistance resistors 30, 32 and 34 are made in serpentine pattern 38 to reduce the inductance of the resistive divider and create long resistive paths. The reduction in inductance of the resistive divider reduces the phase error of the measurement.

In other resistive voltage divider systems, a single high voltage high resistance resistor may be coupled to the high voltage power transmission line, i.e., between the high voltage power transmission line and a low voltage low resistance circuit. However such a design increases stray capacitance along the high voltage high resistance resistor coupled directly to the high voltage power transmission line. The high frequency voltage distribution along the length of resistive divider becomes nonlinear. This voltage distribution is exponential, and causes high stresses at the ends of the resistive voltage divider, particularly the end of the resistor coupled to the high voltage power transmission line, leading to premature failure of sensor that use a single high voltage high resistance resistor coupled to the high voltage power transmission line. When the sensor is exposed to over voltages at higher frequencies such as those caused by switching and lightning, the voltage distribution along the high voltage high resistance resistor is an exponential pattern causing very high stresses on the first one or more undulations of the serpentine pattern adjacent to the high voltage power transmission line. This in turn causes a flash over between the undulations, which lowers the high resistance value of the high voltage high resistance resistor, and results in a different ratio of resistances, causing an inaccurate reading from the sensor. The problem worsens as the number of strikes or transient over-voltage increases, ultimately causing premature failure of the sensor.

In order to avoid premature failure resulting from transient over voltage, the characteristic impedance of the sensor is lowered, which in turn reduces the refraction part of transient over-voltages. This significantly reduces the stresses on the first few serpentine patterns of the high voltage resistors. The characteristic impedance is lowered by using two or more high voltage resistors, e.g., similar high voltage resistors, in parallel. By separating the paths of the pulses, the transient over-voltage is halved.

In one form, voltage line sensor 18 includes high voltage high resistance circuit 28 formed of a plurality of a plurality of high voltage high resistance resistors coupled to high voltage power transmission line 12 in parallel with each other. For example, high voltage high resistance resistors 30, 32 may be coupled to high voltage power transmission line 12. In one form, each of high voltage high resistance resistors 30 and 32 have the same electrical resistance. In other embodiments, they may have different resistance values. In other embodiments, the plurality may include more than two high voltage high resistance resistors coupled to high voltage power transmission line 12 in parallel with each other. Low voltage low resistance circuit 29 is coupled in series between the high voltage high resistance circuit 28 and the reference voltage, e.g., ground 26. For example, in some embodiments, low voltage low resistance circuit 29 may be coupled in series between the plurality of parallel high voltage high resistance resistors and the reference voltage. Low voltage low resistance circuit 29 is constructed to output, e.g., via connector or socket 22, a low voltage proportional to the voltage in high voltage power transmission line 12. Low voltage low resistance circuit 29 is electrically coupled to electrical connector or socket 22, and the output of low voltage low resistance circuit 29 is provided at electrical connector or socket 22, e.g., for measurement by another device, such as an electronic meter (not shown).

In some embodiments, high voltage high resistance circuit 28 may also include one or more high voltage high resistance resistors coupled in series to the parallel coupled high voltage high resistance resistors. For example, in some embodiments, high voltage high resistance resistor 34 is coupled in series to the parallel coupled high voltage high resistance resistors 30, 32 at one end, and is coupled in series to low voltage low resistance circuit 29 at the other end, i.e., is coupled in series between parallel coupled high voltage high resistance resistors 30, 32 and low voltage low resistance circuit 29. In such embodiments, low voltage low resistance circuit 29 is coupled in series between high voltage high resistance resistor 34 and the reference voltage, e.g., ground 26. In other embodiments, low voltage low resistance circuit 29 may be coupled directly to high voltage high resistance resistors 30, 32 without the intervening high voltage high resistance resistor 34.

In various embodiments, body 20 surrounds and encases high voltage high resistance circuit 28, e.g., the plurality of high voltage high resistance resistors coupled in parallel (e.g., high voltage high resistance resistors 30, 32) and the high voltage high resistance resistor (e.g., high voltage high resistance resistor 34), and also surrounds and encases the low voltage low resistance circuit 29. In one form, body 20 is an epoxy casting, e.g., wherein high voltage high resistance resistors 30, 32 and 34, and low voltage low resistance circuit 29 are cast into body 20. In other embodiments, body 20 may take other forms and/or may be formed of other materials. In some embodiments, coils 17 and low voltage circuit 19 may also be cast into body 20.

Figure 5:
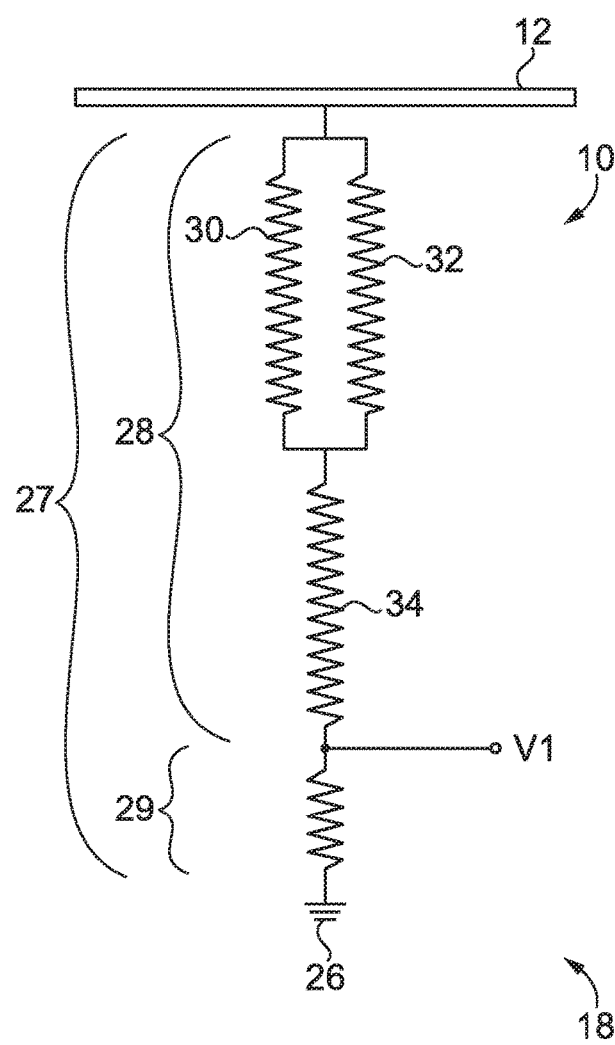
FIG. 5 schematically illustrates some aspects of a non-limiting example of a voltage line sensor for a high voltage line post sensor in accordance with an embodiment of the present invention.

Referring also to FIG. 5, some aspects of a non-limiting example of line post sensor 10 are illustrated in accordance with an embodiment of the present invention in the form of a circuit diagram. In the embodiment of FIG. 5, high voltage high resistance circuit 28 with high voltage high resistance resistors 30, 32 and 34, and low voltage low resistance circuit 29 are illustrated. High voltage high resistance resistors 30, 32 are coupled to high voltage power transmission line 12 in parallel to each other. Low voltage low resistance circuit 29 is coupled to the reference voltage, e.g., ground 26. High voltage high resistance resistor 34 is coupled in series between low voltage low resistance circuit 29 and high voltage high resistance resistors 30, 32 coupled in parallel. The voltage across low voltage low resistance circuit 29 is proportional to the voltage in high voltage power transmission line 12, i.e., based on the resistance of the resistive voltage divider 27 formed by the high voltage high resistance circuit 28 (e.g., high voltage high resistance resistors 30, 32, 34) and the low voltage low resistance circuit 29. This voltage may be measured by electrically coupling a voltage measurement device, e.g., electronic meter (not shown), to electrical connector or socket 22 to obtain the voltage V1 with respect to the reference voltage, e.g., ground 26.

The electrical resistance of low voltage low resistance circuit 29 is set or adjusted to achieve a desired voltage output at the rated or maximum voltage of high voltage power transmission line 12, e.g., 35 kV, based the resistance of high voltage high resistance circuit 28. In one non-limiting example, the output voltage range is set to 0-10 V for a high voltage power transmission line 12 voltage range of 0 V to 35 kV, e.g., a maximum voltage differential of 10 V. The maximum voltage differential occurs at the maximum voltage of high voltage power transmission line 12. In other embodiments, the output voltage range may be 0-120 V, e.g., a maximum voltage differential of 120 V. In other embodiments, the voltage differential may be a different value and may be in a different voltage range. In some embodiments, the electrical resistance of low voltage low resistance circuit 29 is a resistance value in the range of 10 k Ohms to 500 k Ohms to achieve a suitable output voltage range. In other embodiments, the electrical resistance of low voltage low resistance circuit 29 may be a resistance value in the range of 5 k Ohms to 1000 k Ohms. In still other embodiments the electrical resistance of low voltage low resistance circuit 29 may be another range or value.

High voltage high resistance circuit 28 operate across much higher voltage differentials than does low voltage low resistance circuit 29. For example, for a 35 kV system, in some embodiments, high voltage high resistance circuit 28 operates across a voltage differential of at least 34.9 kV. As another example, for a 10 kV system, in some embodiments, high voltage high resistance circuit 28 operates across a voltage differential of at least 9.9 kV. In one non-limiting example, the resistance of high voltage high resistance resistors 30, 32 and 34 is 20 M Ohm, e.g., for a 35 kV voltage in high voltage power transmission line 12. In this example, the voltage drop across high voltage high resistance resistors 30, 32 is slightly less than one third of the voltage differential between high voltage power transmission line 12, and the voltage drop across high voltage high resistance resistor 34 is slightly less than two thirds of the voltage differential between high voltage power transmission line 12, with the difference in voltage drop occurring across low voltage low resistance circuit 29. Thus, for a 35 kV system, the voltage drop across high voltage high resistance resistors 30, 32 is at least 11.5 kV, and the voltage drop across high voltage high resistance resistor 34 is at least 23 kV. In other embodiments, the resistance value for the high voltage high resistance resistors may vary with the needs of the application.

Embodiments of the present invention include a high voltage line post sensor for a high voltage power distribution system having a high voltage power transmission line for transmitting electrical power at a high voltage, comprising: a voltage line sensor, comprising: a high voltage high resistance circuit including a first high voltage high resistance resistor coupled to the high voltage power transmission line and a second high voltage high resistance resistor coupled to the high voltage power transmission line in parallel to the first resistor; and a low voltage low resistance circuit coupled in series between the high voltage high resistance circuit and a reference voltage; and a body surrounding and encasing the high voltage high resistance circuit and the low voltage low resistance circuit.

In a refinement, the voltage line sensor includes a resistive voltage divider formed by the high voltage high resistance circuit and the low voltage low resistance circuit.

In another refinement, each of the first high voltage high resistance resistor and the second high voltage high resistance resistor are each constructed to operate across at least an 11.5 kV voltage differential for a 35 kV high voltage power transmission line.

In yet another refinement, the high voltage high resistance circuit further includes a third high voltage high resistance resistor coupled in series to the first high voltage resistor and the second high voltage resistor, and coupled in series to the low voltage low resistance circuit.

In still another refinement, the third high voltage high resistance resistor has a resistance of 20 M Ohms.

In yet still another refinement, the third high voltage high resistance resistor is constructed to operate across at least a 23 kV voltage differential for a 35 kV high voltage power transmission line.

In a further refinement, wherein the first high voltage high resistance resistor and the second high voltage high resistance resistor each have the same resistance.

In another further refinement, the first high voltage high resistance resistor and the second high voltage high resistance resistor each have a resistance of at least 20 M Ohms.

In a yet further refinement, the low voltage low resistance circuit operates across a maximum voltage differential having a voltage value in the range from 10 V to 120 V.

In a still further refinement, the low voltage low resistance circuit has a resistance in the range of 10 k Ohms to 500 k Ohms.

In a yet still further refinement, wherein the reference voltage is ground.

Embodiments of the present invention include a high voltage line post sensor for a high voltage power distribution system having a high voltage power transmission line for transmitting electrical power at a high voltage, comprising: a clamp for clamping the high voltage line post sensor to the high voltage power transmission line and electrically coupling the line post sensor to the high voltage power transmission line; a voltage line sensor electrically coupled to the high voltage power transmission line and constructed to measure the voltage in the high voltage power transmission line, the voltage line sensor comprising: a plurality of first high voltage high resistance resistors coupled in parallel to the high voltage power transmission line; a second high voltage high resistance resistor coupled in series to the plurality of high voltage high resistance resistors; and a low voltage low resistance circuit coupled in series between the second high voltage high resistance resistor and a reference voltage, wherein the low voltage low resistance circuit is constructed to output a low voltage proportional to the voltage in the high voltage power transmission line; and a body surrounding and encasing the plurality of high voltage high resistance resistors coupled in parallel, the high voltage high resistance resistor coupled in series to the plurality of high voltage high resistance resistors, and the low voltage low resistance circuit.

In a refinement, the plurality of first high voltage high resistance resistors and the second high voltage high resistance resistor form a high voltage high resistance circuit, and the voltage line sensor includes a resistive voltage divider formed by the high voltage high resistance circuit and the low voltage low resistance circuit.

In another refinement, the high voltage line post sensor further comprises a voltage current sensor constructed to measure a current in the high voltage power transmission line.

In yet another refinement, the voltage current sensor includes a coil constructed to sense current in the high voltage power transmission line; and a low voltage circuit constructed to output a voltage proportional to the current.

In still another refinement, the body is an epoxy casting.

In yet still another refinement, the plurality of first high voltage high resistance resistors and the second high voltage high resistance resistor are cast into the body.

In a further refinement, the plurality of first high voltage high resistance resistors are serpentine resistors.

In a yet further refinement, the second high voltage high resistance resistor is a serpentine resistor.

In a still further refinement, the reference voltage is ground.

While the invention has been illustrated and described in detail in the drawings and foregoing description, the same is to be considered as illustrative and not restrictive in character, it being understood that only the preferred embodiments have been shown and described and that all changes and modifications that come within the spirit of the inventions are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

What is claimed is:

1. A high voltage line post sensor for a high voltage power distribution system having a high voltage power transmission line for transmitting electrical power at a high voltage, comprising:
a voltage line sensor, comprising:
   a high voltage high resistance circuit including a first high voltage high resistance resistor coupled to the high voltage power transmission line and a second high voltage high resistance resistor coupled to the high voltage power transmission line in parallel to the first high voltage high resistance resistor, a resistance of the first high voltage high resistance resistor being similar to a resistance of the second high voltage high resistance resistor, each of the first and second high voltage high resistance resistors being a serpentine resistor having a serpentine pattern that lowers a characteristic impedance of the voltage line sensor, the lowered characteristic impedance lowering stresses on the serpentine patterns of the first and second high voltage high resistance resistors and reduce a refraction part of a transient over-voltage; and
   a low voltage low resistance circuit coupled in series between the high voltage high resistance circuit and a reference voltage; and
a body surrounding and encasing the high voltage high resistance circuit and the low voltage low resistance circuit,
wherein a voltage level of the high voltage power transmission line is determined using a ratio between a resistance of the high voltage high resistance circuit comprising a resistance of the first and second high voltage high resistance resistors, and a resistance of the low voltage low resistance circuit.

2. The high voltage line post sensor of claim 1, wherein the voltage line sensor includes a resistive voltage divider formed by the high voltage high resistance circuit and the low voltage low resistance circuit.

3. The high voltage line sensor of claim 1, wherein each of the first high voltage high resistance resistor and the second high voltage high resistance resistor are each constructed to operate across at least an 11.5 kV voltage differential for a 35 kV high voltage power transmission line.

4. The high voltage line post sensor of claim 1, wherein the high voltage high resistance circuit further includes a third high voltage high resistance resistor coupled in series to the first high voltage high resistance resistor and the second high voltage high resistance resistor, and coupled in series to the low voltage low resistance circuit.

5. The high voltage line post sensor of claim 4, wherein the third high voltage high resistance resistor has a resistance of 20 M Ohms, and wherein the third high voltage high resistance resistor is a serpentine resistor.

6. The high voltage line post sensor of claim 4, wherein the third high voltage high resistance resistor is constructed to operate across at least a 23 kV voltage differential for a 35 kV high voltage power transmission line.

7. The high voltage line post sensor of claim 4, wherein the first high voltage high resistance resistor and the second high voltage high resistance resistor each have the same resistance.

8. The high voltage line post sensor of claim 7, wherein the first high voltage high resistance resistor and the second high voltage high resistance resistor each have a resistance of at least 20 M Ohms.

9. The high voltage line post sensor of claim 1, wherein the low voltage low resistance circuit operates across a maximum voltage differential having a voltage value in the range from 10 V to 120 V.

10. The high voltage line post sensor of claim 1, wherein the low voltage low resistance circuit has a resistance in the range of 10 k Ohms to 500 k Ohms.

11. The high voltage line post sensor of claim 1, wherein the reference voltage is ground.

12. A high voltage line post sensor for a high voltage power distribution system having a high voltage power transmission line for transmitting electrical power at a high voltage, comprising:
- a clamp for clamping the high voltage line post sensor to the high voltage power transmission line and electrically coupling the high voltage line post sensor to the high voltage power transmission line;
- a voltage line sensor electrically coupled to the high voltage power transmission line and constructed to measure the voltage in the high voltage power transmission line, the voltage line sensor comprising:
  - a high voltage high resistance circuit comprising a plurality of first high voltage high resistance resistors coupled in parallel to the high voltage power transmission line, and a second high voltage high resistance resistor coupled in series to the plurality of first high voltage high resistance resistors, a resistance of the plurality of first high voltage high resistance resistors being similar to a resistance of the second high voltage high resistance resistor, each of the first plurality of first high voltage high resistance resistors and the second high voltage high resistance resistor being a serpentine resistor having a serpentine pattern that lowers a characteristic impedance of the voltage line sensor, the lowered characteristic impedance lowering stresses on the serpentine patterns of the plurality of first high voltage high resistance resistors and h te second high voltage high resistance resistor and reduce a refraction part of a transient over-voltage; and
  - a low voltage low resistance circuit coupled in series between the second high voltage high resistance resistor and a reference voltage, wherein the low voltage low resistance circuit is constructed to output a low voltage proportional to the voltage in the high voltage power transmission line; and
- a body surrounding and encasing the plurality of first high voltage high resistance resistors coupled in parallel, the second high voltage high resistance resistor coupled in series to the plurality of first high voltage high resistance resistors, and the low voltage low resistance circuit,
wherein a voltage level of the high voltage power transmission line is determined using a ratio between a resistance of the plurality of first high voltage high resistance resistors and the second high voltage high resistance resistor, and a resistance of the low voltage low resistance circuit.

13. The high voltage line post sensor of claim 12, wherein the plurality of first high voltage high resistance resistors and the second high voltage high resistance resistor form a high voltage high resistance circuit, and wherein the voltage line sensor includes a resistive voltage divider formed by the high voltage high resistance circuit and the low voltage low resistance circuit.

14. The high voltage line post sensor of claim 12, further comprising a high voltage current sensor constructed to measure a current in the high voltage power transmission line.

15. The high voltage line post sensor of claim 14, wherein the high voltage current sensor includes a coil constructed to sense the current in the high voltage power transmission line; and a low voltage circuit constructed to output a voltage proportional to the current.

16. The high voltage line post sensor of claim 12, wherein the body is an epoxy casting.

17. The high voltage line post sensor of claim 16, wherein the plurality of first high voltage high resistance resistors and the second high voltage high resistance resistor are cast into the body.

18. The high voltage line post sensor of claim 12, wherein the serpentine patterns of the plurality of first high voltage high resistance resistors comprises a plurality of switchbacks or undulations that provide a continuous high resistance path.

19. The high voltage line post sensor of claim 12, wherein the serpentine pattern of the second high voltage high resistance resistor comprises a plurality of switchbacks or undulations that provide a continuous high resistance path.

20. The high voltage line post sensor of claim 12, wherein the reference voltage is ground.

* * * * *